United States Patent
Vanderhaegen et al.

(10) Patent No.: US 8,149,151 B2
(45) Date of Patent: Apr. 3, 2012

(54) SECOND ORDER DYNAMIC ELEMENT ROTATION SCHEME

(75) Inventors: Johan Peter Vanderhaegen, Sunnyvale, CA (US); Christoph Lang, Cupertino, CA (US); Crist Lu, Fremont, CA (US)

(73) Assignee: Robert Bosch GmbH, Stuttgart (DE)

( * ) Notice: Subject to any disclaimer, the term of this patent is extended or adjusted under 35 U.S.C. 154(b) by 108 days.

(21) Appl. No.: 12/767,346

(22) Filed: Apr. 26, 2010

(65) Prior Publication Data

US 2011/0260900 A1    Oct. 27, 2011

(51) Int. Cl.
H03M 1/66    (2006.01)

(52) U.S. Cl. ......................................... 341/144; 341/143

(58) Field of Classification Search .................. 341/118, 341/120, 143, 144
See application file for complete search history.

(56) References Cited

U.S. PATENT DOCUMENTS

| | | | |
|---|---|---|---|
| 6,677,875 B2 * | 1/2004 | Dagher et al. | 341/143 |
| 2002/0105453 A1 * | 8/2002 | Fujimori et al. | 341/144 |
| 2003/0201922 A1 | 10/2003 | Dagher et al. | |
| 2006/0231732 A1 * | 10/2006 | Yan | 250/208.1 |
| 2007/0040720 A1 | 2/2007 | Kim | |
| 2007/0252573 A1 * | 11/2007 | Tachibana et al. | 323/313 |
| 2008/0079615 A1 | 4/2008 | Kim | |
| 2009/0140897 A1 | 6/2009 | Healy et al. | |

FOREIGN PATENT DOCUMENTS

EP    2159918 A2    3/2010

OTHER PUBLICATIONS

Robert, J. and P. Deval (1988). "A second-order high-resolution incremental A/D converter with offset and charge injection compensation." (6 pages).
Markus, J., J. Silva, et al. (2004). "Theory and applications of incremental DeltaSigma converters." IEEE Transactions on Circuits and Systems I: Fundamental Theory and Applications 51(4): 678-690 (13 pages).
Baird, R.T. and Fiez, T.S.. "Linearity Enhancement of Multibit SigmaDelta A/D and D/A converters using data weighted averaging." IEEE Transactions on Circuits and Systems II, vol. 42, No. 12, pp. 753-762, Dec. 1995 (35 pages).
International Search Report in corresponding PCT application (i.e., PCT/US2011/033838), mailed Jun. 30, 2011 (14 pages).

* cited by examiner

*Primary Examiner* — Howard Williams
(74) *Attorney, Agent, or Firm* — Maginot, Moore & Beck

(57) ABSTRACT

A sensor system for generating sample analog signals for processing by a signal processing circuit that utilizes non-constant weights includes a plurality of signal generating elements and a switching network having a plurality of switches operably coupled to the plurality of signal generating elements. The switching network is configured to switch the plurality of signal generating elements between a plurality of different configurations. The system includes a dynamic element matching (DEM) control system for controlling the switch network to implement a second order DEM rotation scheme in which the plurality of signal generating elements are switched to each configuration in the plurality of configurations in a first sequence and then switched to each configuration in the plurality in a second sequence, the second sequence being the reverse of the first sequence.

18 Claims, 3 Drawing Sheets

SECOND ORDER DYNAMIC ELEMENT ROTATION SCHEME

FIELD OF THE INVENTION

This invention relates to a dynamic element rotation schemes for use in circuits that provide analog signals to second order and higher analog-to-digital converters.

BACKGROUND

In the design of integrated circuits, it is often desirable to create, as part of the design, devices having a fixed ratio of some of their characteristics. Here, the term "devices" refers to circuit elements such as transistors, capacitors, etc. . . . To achieve the required performance of the circuit, it is often necessary to manufacture this ratio to a very high degree of accuracy compared with the designed-for value. Deviations from this ratio can lead to offset or linearity errors.

If this ratio is an integer or a rational number then the devices are usually constructed using the appropriate number of unit elements. For example, to create two devices with a ratio of 2/3, five equal unit elements are created and three unit elements are assigned to one of the devices and two unit elements to the other one. This eliminates secondary device effects which are dependent on the actual device geometry as opposed to on the area alone.

However, the manufacturing process for semiconductor chips produces artifacts in nominally equal devices. These artifacts include both systematic variation for all devices of a particular type on a single chip or wafer as well as random variations between individual devices on a single chip. These latter random variations, called mismatch, disturb the nominally equal nature of the devices. For example, referring to the example above of using five unit elements for implementing two devices with a 2/3 ratio, random variations in the dimensions of the unit elements may result in the ratio of the two devices deviating from the desired 2/3 ratio.

A technique called "dynamic element matching" (DEM) exists that can ameliorate this mismatch. In DEM, the different elements used to implement devices having a desired ratio are rotated through different positions in the system over time, so that the time average of the device ratio will be substantially closer to the ideal value. For instance, in the example of using five unit elements to create the ratio 2/3, ten different combinations of the elements may be used to implement the two devices having the 2/3 ratio. The average of these ten combinations will lead exactly to the ideal ratio 2/3, even with deviations for each of the individual combinations stemming from random variations in the five unit elements.

During operation, the elements are cycled through each of the possible configurations in sequence, and the elements are activated in each configuration to generate a sample analog signal. The sample analog signals from each combination of elements in the sequence are output to a signal processing system, such as an ADC. Due to mismatch, each configuration of elements generates a sample analog signal having a slightly different value. The ADC averages the sample analog signals to arrive at a digital output value for use in subsequent digital signal processing.

To allow DEM to mitigate the effects of device mismatch, the sample analog signals generated by each configuration of elements must contribute with the same weight to the final output result. Such a system is referred to herein as a "system with constant weights." One type of system that uses constant weights is a first order resettable sigma-delta ADC, sometimes called a first order incremental ADC. An incremental ADC is an oversampling ADC that is configured to convert a plurality of samples of an analog signal into a digital bit stream using a resettable analog accumulator and thus is particularly suited for processing analog signals generated using DEM.

A block diagram of an example of a first order incremental ADC 100 is shown in FIG. 1. During operation of the ADC 100, the sample analog signals generated by the different element configurations are input to the integrator 104. The output of the integrator 104 is converted into a digital value by an ADC 108. The output of the ADC 108 is provided to a digital integrator 110, which operates as a digital filter to generate the output 3040 for the ADC 100. The output of the ADC 108 is also fed to a digital-to-analog converter (DAC) 114 in the feedback path of the ADC 108. The DAC 114 outputs an analog signal that is added to the input signal at the summing node 118.

The integration on this composite signal by the integrator 104 moves the signal noise into the high frequency components of the integrator's 104 output. After conversion of the integrator's output by the ADC 108, the digital filter 110 operates as a low pass filter, which removes the high frequency components, including the noise. In particular, the digital filter 110 is configured to implement a first order transfer function, also referred to herein as a weighting function, for integrating, or averaging, the samples to generate the digital output. In the averaging implemented in a first order incremental ADC, each sample contributes with the same factor or weight to the final result. Thus, the weight at which each sample in a plurality of samples contributes to the final result is (1/S). If the total number of samples used to calculate the output value is ten, then the weight allocated to each sample is 1/10, or 0.1 as depicted in the graph of FIG. 2.

If conventional averaging takes place, such as in a first-order incremental ADC, cycling through each of the possible combinations of elements reduces the effect of unit element mismatch. For a system implemented using a number N of unit elements having a number M of possible configurations in the system, a cycling sequence may be denoted as i, where $i \in \{1, 2, \ldots, M\}$. If the required number of samples to make a conversion is greater than the number of combinations, the sequence i is repeated until the required number of samples has been collected. In a first order incremental ADC, the same weight is allocated to each sample for the computation of the average regardless of the number of samples utilized. Since an equal weight is allocated to samples generated by each combination, mismatch between the combinations is averaged. For example, if each of the M combinations has a random variation $\Delta_i$ for $i \in \{1, 2, \ldots, M\}$, then the final result has a random variation equal to $$\frac{1}{M}\sum \Delta_i.$$

Accordingly, if the sequence of combination of elements consists of all possible combinations of these unit elements, than this averaging will lead to the random variations effectively canceling each other out so that the final result will have no random variation.

One disadvantage to the use of first order incremental ADCs for analog signal processing, however, is a relatively slow conversion time. For example, for n-bit resolution, the ADC needs $2^n$ integrations, or clock periods, for each conversion cycle resulting in a very slow conversion rate in relation to the ADC's clock frequency. Conversion times may be made faster by increasing the order of the incremental ADC. The order level of the ADC refers to the total number of integrators in the ADC. For example, for the first order incremental ADC shown in FIG. 1, a single integrator 104 is provided; a second order incremental ADC has two integrators; a third order incremental ADC has three integrators; etc.

In second order and higher incremental ADCs, however, the weights allocated to the samples are not equal. If the same DEM cycling scheme $i \in \{1, 2, \ldots, M\}$ is used, then the random variation, $\Delta i$, of each sample at the output of the ADC is given by $$\frac{2}{M(M+1)} \sum i \Delta_i.$$

Consequently, the random variation of each sample does not contribute equally to the average and the output has a much higher residual variation relative to a first order incremental ADC. The residual variation increases with the order of the incremental ADC.

Accordingly, what is needed is a sensor and/or a method of operating a sensor in which the sample analog signals output by the sensor are suitable for processing by a system with non-constant weights, such as second order and higher incremental ADCs. In particular, what is needed is a second order dynamic element rotation scheme for sensors that enables second order and higher incremental ADCs to be utilized for integrating and converting the sample signals into a digital output with a lower residual variation relative to previously known schemes.

SUMMARY

In accordance with one embodiment, there is provided a sensor system for generating sample analog signals for processing by a signal processing circuit that utilizes non-constant weights includes a plurality of signal generating elements and a switching network having a plurality of switches operably coupled to the plurality of signal generating elements. The switching network is configured to switch the plurality of signal generating elements between a plurality of different configurations. The system includes a dynamic element matching (DEM) control system for controlling the switch network to implement a second order DEM rotation scheme in which the plurality of signal generating elements are switched to each configuration in the plurality of configurations in a first sequence and then switched to each configuration in the plurality in a second sequence, the second sequence being the reverse of the first sequence.

In accordance with another embodiment, a method of operating a sensor system to generate sample analog signals for processing by a signal processing circuit that utilizes non-constant weights is provided. The sensor system includes a plurality of signal generating elements for implementing a sensor assembly, and the plurality of signal generating elements being operably coupled for switching between a plurality of possible combinations for implementing the sensor assembly. The method comprises switching the plurality of signal generating elements to each of the possible configurations in a first sequence, and activating the plurality of circuit elements to output a sample analog signal for each configuration in the first sequence. After the first sequence, the plurality of signal generating elements are switched to each of the possible configurations in a second sequence, the second sequence being the reverse of the first sequence, and activated to output a sample analog signal for each configuration in the second sequence.

In accordance with a further embodiment, a signal generating and processing system is provided. The system comprises a plurality of signal generating elements and a switching network having a plurality of switches operably coupled to the plurality of signal generating elements. The switching network is configured to switch the plurality of signal generating elements between a plurality of different configurations. The system includes a dynamic element matching (DEM) control system for controlling the switch network to implement a second order DEM rotation scheme in which the plurality of signal generating elements are switched to each configuration in the plurality of configurations in a first sequence and then switched to each configuration in the plurality in a second sequence, the second sequence being the reverse of the first sequence. The signal generating elements are activated in each configuration in the first and the second sequence to output a sample analog signal. The system includes a signal processing circuit for receiving the sample analog signals. The signal processing circuit is configured to combine the sample analog signals received during the second order DEM rotation scheme in accordance with a noise shaping function to generate a discrete output value. The noise shaping function allocating non-constant weights to each of the sample analog signals at which the sample analog signals contribute to the generation of the discrete output value.

DESCRIPTION

Figure 1:
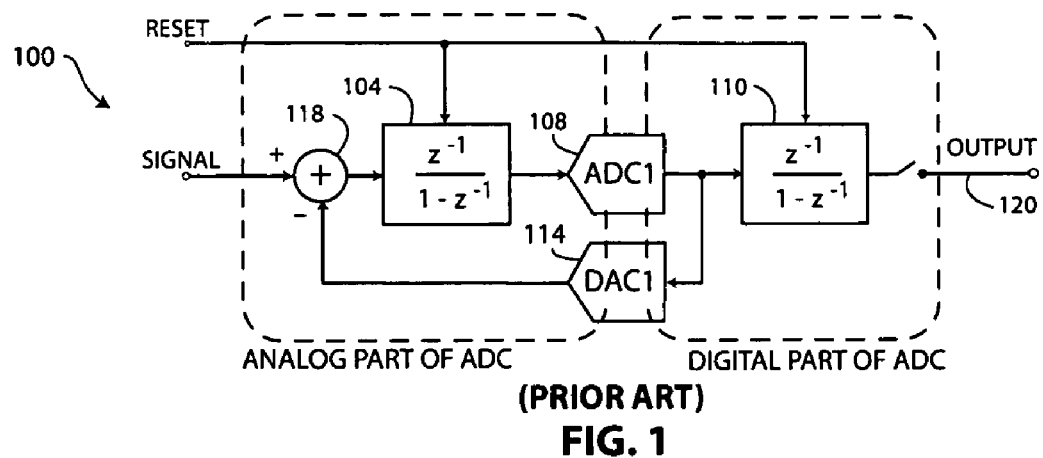
FIG. 1 is a block diagram of a first order incremental ADC.
Figure 2:
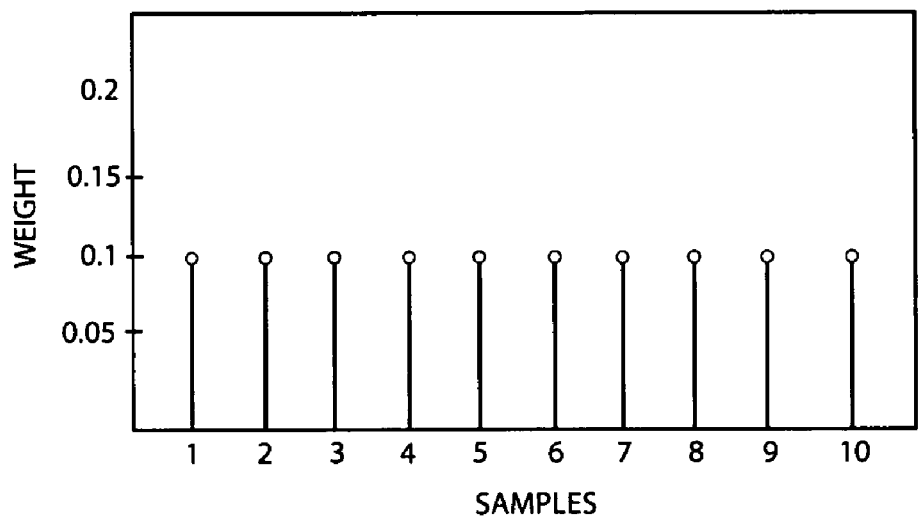
FIG. 2 is a graph of the sample weights for a first order incremental ADC using 10 samples.

For the purposes of promoting an understanding of the principles of the invention, reference will now be made to the embodiments illustrated in the drawings and described in the following written specification. It is understood that no limitation to the scope of the invention is thereby intended. It is further understood that the present invention includes any alterations and modifications to the illustrated embodiments and includes further applications of the principles of the invention as would normally occur to one skilled in the art to which this invention pertains.

Figure 3:
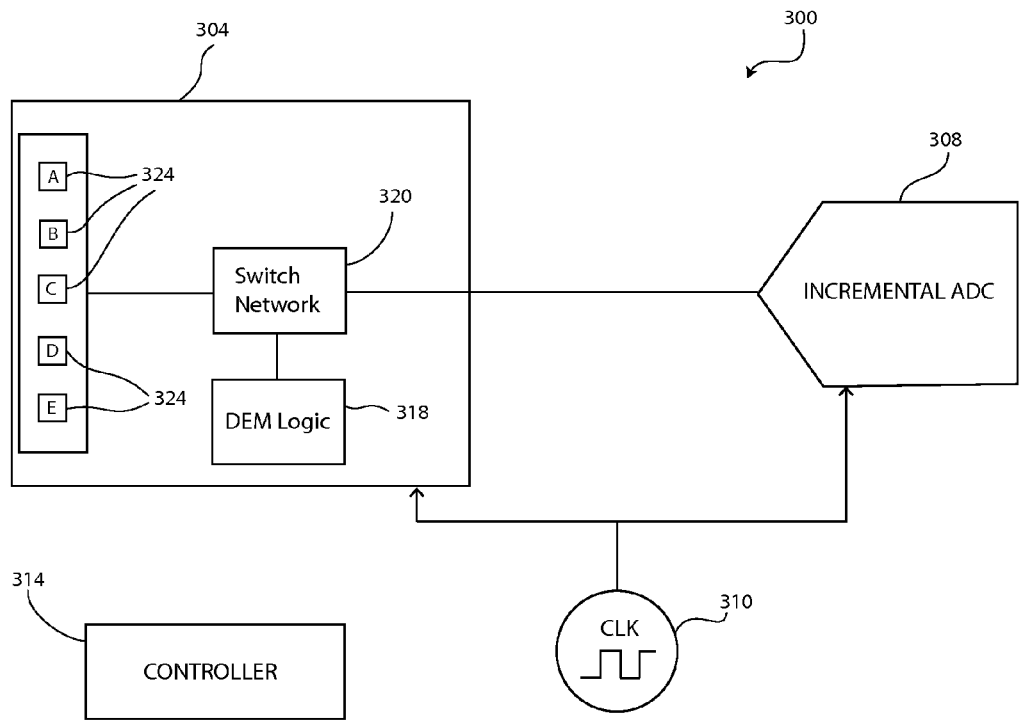
FIG. 3 is a block diagram of a analog signal generating and processing system according to one embodiment of the present invention.

FIG. 3 depicts a block diagram of an analog signal generating and processing system 300 that includes a dynamic element matching (DEM) sensor 304, an analog signal processing circuit, or incremental ADC 308, and a system clock 310. In one embodiment, the DEM sensor 304, incremental ADC 308, and the clock 310 are all located on the same semiconductor substrate. In alternative embodiments, various combinations of the components are located on different semiconductor devices. As explained below, the DEM sensor 304 is configured to selectively output sample analog signals to the incremental ADC 308 in accordance with a second order DEM rotation scheme. The system clock 310 sets the sample rate at which the sample analog signals are output to the incremental ADC 308.

The incremental ADC 308 is configured to accumulate the sample analog signals generated in accordance with the second order DEM rotation scheme and to integrate them to generate an output having a discrete value that corresponds to a weighted average of the sample analog signals. The process of accumulating analog samples and integrating them into a digital output is referred to herein as a conversion cycle. The incremental ADC 308 is configured to accumulate a predetermined number S of samples per conversion cycle for the integration. As used herein, a "weighted average" refers to an average of the values of the sample analog signals in which each sample is allocated a weight or factor at which it contributes to the digital output value. As opposed to a system that uses constant weights for generating the weighted average, the incremental ADC 308 of FIG. 3 is configured to allocate non-constant weights to the samples in computing the weighted average (explained in more detail below).

DEM sensor 304, analog signal processing circuit 14, and system clock 16 may each be operably connected to a controller 314. Controller 314 enables the various device parameters to be set or programmed into the system. Controller 314 may be implemented in software, hardware, or both, and provides an application programming interface (API) that allows an operator to designate parameters for the system. Examples such parameters include the number of samples required per conversion, the sample rate, clock frequency, number of bits of resolution for the digital output, and the like. In addition, control system 18 may generate suitable signals for the system to, for example, initiate conversion cycles, and to reset integrators and count values (e.g., Reset) at the beginning of each conversion cycle.

Figure 4:
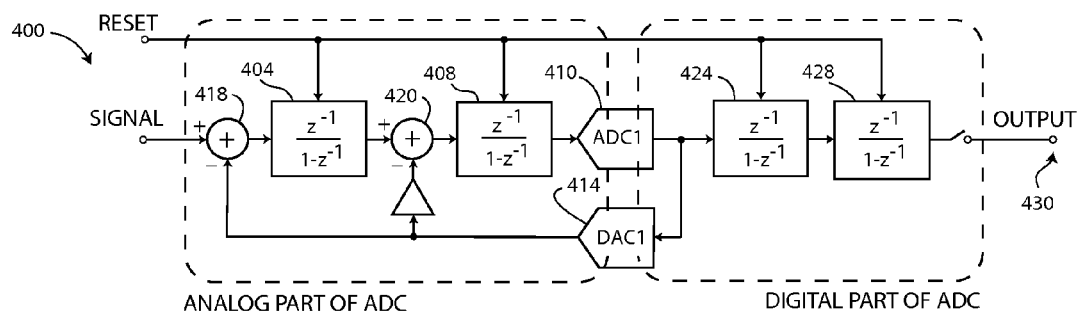
FIG. 4 is a block diagram of a second order incremental ADC for use with the system of FIG. 3.

As mentioned, the incremental ADC 308 allocates non-constant weights to the samples in computing the weighted average. One embodiment of an incremental ADC 308 that utilizes non-constant weights for processing the sample analog signals generated by the DEM sensor 304 is depicted in FIG. 4. The incremental ADC of FIG. 4 comprises a second order incremental ADC 400. The operation of the second order incremental ADC 400 is similar to that of a first order incremental ADC. However, the addition of a second analog integrator enables the sample analog signals to be resolved for n bits with $2^{n/2}$ samples. Thus, the conversion time for a second order incremental ADC is approximately the square root of what it is for first order incremental ADCs.

As depicted in FIG. 4, the second order incremental ADC 400 includes two analog integrators 404, 408 and two digital integrators 424, 428, which form a digital filter. The sample analog input signals are integrated by the analog integrators 404, 406 and then provided to an ADC 410 which quantizes the integrated sample signals. A DAC 414 converts the quantized output of the ADC 410 to an analog signal for feedback to both integrators 404, 408 via the summing nodes 418 and 420. The quantized output of the ADC 410 is provided to the two digital integrators 424, 428 which integrate the sample signals to generate a digital output at terminal 430 having discrete value that is a weighted average of the sample signals.

Figure 5:
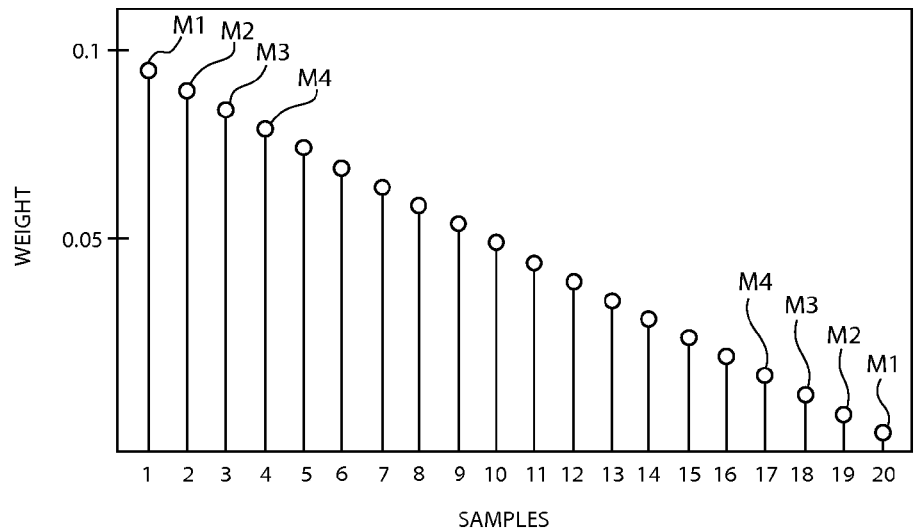
FIG. 5 is a graph of the sample weights for a second order incremental ADC using 20 samples.

The digital filter implemented by the digital integrators 424, 428 is configured to integrate a plurality of samples in accordance with a second order transfer function to generate a digital output value. As used herein, a second order transfer function, or weighting function, is a linear, non-constant weighting function. The linear and non-linear aspects of a weighting function refer to the variation of the weights with the sample position. In a linear, non-constant weighting function, the difference between the weights allocated to consecutive samples is the same for each consecutive sample. A plot of the weights allocated to S number of samples is a straight line having a slope of (1/S)/(S+1), i.e., 1/(S(S+1)). For example, FIG. 5 shows a graph of the weights allocated to S=20 samples in accordance with an embodiment of a linear, non-constant weighting function implemented in ADC 400.

A predetermined number of samples are provided to the ADC 400 in a conversion cycle to generate a digital output value. The number of samples used per conversion may be set for the ADC via the controller 314 (FIG. 3). For processing signals generated by the second order DEM rotation scheme, the number of samples per conversion cycle is set to a multiple of the total number of samples S generated by the DEM sensor 304 in accordance with the second order DEM rotation scheme. The analog sample signals from the DEM sensor 304 are provided to the ADC 308 at a sample rate set by the system clock 310.

Referring again to FIG. 3, the DEM sensor 304 includes a plurality of analog signal generating elements 324 for generating the analog sample signals in accordance with the second order DEM rotation scheme. In one embodiment, the signal generating elements 324 of the DEM sensor 304 are configured to implement a sensor assembly for detecting or measuring a physical characteristic or parameter of an object or the environment, such as temperature, pressure, flow, and the like. In particular, the plurality of signal generating elements 324 implement one or more circuit devices, such as transistors, resistors, capacitors, and the like, for generating the analog output signals that have a characteristic, such as voltage or current level, that changes in proportion to changes in the sensed parameter. The signal generating elements 324 may each be designed to have substantially the same unit size and shape, or multiples of a unit size, except for random variations that may be introduced during the manufacturing process.

The signal generating elements 324 are capable of being arranged in a number M of configurations for implementing the circuit devices of the sensor assembly. The number M of configurations of signal generating elements 324 depends on the number of signal generating elements 324 and the number and type of devices implemented. In addition, as part of the sensor design, the signal generating elements 324 may be required to implement circuit devices having a predetermined ratio with respect to each other. In the exemplary embodiment of FIG. 3, the plurality of signal generating elements 324 comprise five signal generating elements A, B, C, D, and E for implementing two devices that have, for example, a 2/3 ratio with respect to each other. The device ratio may be implemented by assigning or allocating three signal generating elements of the five to a first device and two signal generating elements of the five to a second device. To implement two devices, the five signal generating elements A, B, C, D, and E may be assigned to the first and second devices in ten different combinations M, also referred to as configurations, having the 2/3 ratio, e.g., $M_1$={(1)ABC, (2)DE}, $M_2$={(1)ABD, (2)CE}, $M_3$={(1)ABE, (2)CD}, $M_4$={(1)ACD, (2)BE}, $M_5$={(1)ACE, (2)BD}, $M_6$={(1)ADE, (2)BC}, $M_7$={(1)BCD, (2)AE}, $M_8$={(1)BCE, (2)AD}, $M_9$={(1)BDE, (2)AC}, and $M_{10}$={(1)CDE, (2)AB}.

The plurality of signal generating elements 324 is interconnected by a switching network 320 that enables the analog signal generating elements 324 to be selectively switched to each of the possible configurations or combinations for outputting sample analog signals to the incremental ADC 308.

Switch networks for switching circuit elements between a plurality of combinations or configurations are known and may depend on the number of signal elements, the number of circuit devices the elements implement, and the how the circuit devices are intended to be connected for the type of sensor. The switch network 320 is in turn controlled by DEM logic 318. DEM logic 318 is configured to control the switch network 320 in a known manner to switch the plurality of signal generating elements 324 between the various combinations of elements in accordance with a rotation scheme.

As mentioned, due to random variations in the characteristics of the signal generating elements, the sample signals output by each combination of signal generating elements 324 may each have a different value. In a first order DEM rotation scheme, the signal generating elements are cycled through each possible combination of elements in a sequence. For example, with the ten combinations M of signal generating elements 324 described above, such a sequence may be denoted as $i \in \{M_1, M_2, M_3, \ldots M_{10}\}$. The sequence i is repeated until the required number of samples have been accumulated by the ADC for a conversion cycle at which point the samples are integrated and the output value is generated. When each sample in a conversion cycle is allocated the same weight (i.e., 1/S, where S is the total number of samples) to compute the weighted average, such as for a first order incremental ADC, the random variations of each combination of elements used to generate the samples are averaged against each other so that they effectively cancel each other out. However, when the samples generated by the combination sequence $i \in \{M_1, M_2, M_3, \ldots M_{10}\}$ are allocated non-constant weights for computing the average, the random variations of each combination do not contribute equally to the output. Therefore, the random variations are not averaged against each other resulting in the output having higher residual variation relative to a system that uses constant weights such as a first order incremental ADC.

To reduce or eliminate the random variations or residual variation in the weighted average of the samples for a system with non-constant weights, such as the second order incremental ADC 400 of FIG. 4, the DEM sensor 304 is configured to utilize a second order DEM rotation scheme to generate the sample analog signals for the incremental ADC 308. In a second order DEM rotation scheme, the DEM control system controls the switch network to switch the signal generating elements between the M possible combinations in a predetermined sequence that enables the random variations in each of the possible combinations to be averaged against each other, such as in a first order incremental ADC, even when the signals are processed in accordance with a linear, non-constant weighting function, such as utilized in the second order incremental ADC as depicted in FIG. 4.

In one embodiment, the second order DEM rotation scheme for use with systems that use linear, non-constant weights, such as the second order incremental ADC 400 of FIG. 4, comprises switching the signal generating elements 324 to each of the possible combination of elements in a first sequence and then switching the elements to each of the possible configurations in a second sequence that is the opposite of the first sequence. For example, a second order DEM rotation scheme for the DEM sensor 304 of FIG. 3 in which the five elements 324 may be arranged in ten combinations M to implement the desired sensor comprises switching the elements 324 to each of the ten possible configurations in the sequence $j_1$, where $j_1 \in \{M_1, M_2, M_3, \ldots M_{10}\}$, and then switching the elements to each of the possible configurations in a second sequence $i_2$ that is the opposite of the first sequence, where $j_2 \in \{M_{10}, M_9, M_8, \ldots M_1\}$. Thus, in one embodiment, the second order DEM rotation scheme may be denoted as the sequence j where $j \in \{M_1, M_2, M_3, \ldots M_{10}, M_{10}, M_9, M_8, \ldots M_1\}$.

The signal generating elements 324 are activated for each combination in the sequence j dictated by the second order DEM rotation scheme to output a sample analog signal to the ADC 308. Thus, each of the possible combinations M of elements generates two sample signals during the second order DEM rotation scheme for a total of 2*M samples. Once the signal generating elements 324 have been cycled through the different combinations in accordance with the second order DEM rotation scheme and 2*M samples have been output to the ADC, the ADC 308 integrates the samples in accordance with the second order noise shaping function as described above for the generation of the output value. For example, a sample weight is allocated to each sample based on the order that the samples are received from the DEM sensor 304. As depicted in FIG. 5, the $1^{st}$ sample and the $20^{th}$ sample are each generated by the combination $M_1$, the $2^{nd}$ sample and the $19^{th}$ sample are each generated by the combination $M_2$, the $3^{rd}$ sample and the $18^{th}$ sample are each generated by the combination $M_3$, and so on. Thus, the highest weight and the lowest weight are allocated to the two samples generated by the combination $M_1$, the second highest weight and the second lowest weight are allocated to the two samples generated by the combination $M_2$ . . . etc. Consequently, an average of the sample weights allocated to each combination $M_1$ to $M_{10}$ is substantially the same.

Accordingly, using the second order DEM rotation scheme, each combination $M_1$ to $M_{10}$ contributes with the same factor or weight to the computation of the weighted average for the output value. Because each combination $M_1$ to $M_{10}$ contributes equally, the random variations of each combination $M_1$ to $M_{10}$ are averaged against each other so that they effectively cancel each other out. More specifically, for a system with non-constant, but linear weights, such as a second order incremental ADC with the sample weights from FIG. 5, using the second order DEM rotation scheme leads to the final result having a random variation of:

$$\frac{2}{2M(2M+1)} \left( \sum_{i=M+1}^{2M} i\Delta_{2M+1-i} + \sum_{i=1}^{M} i\Delta_i \right) = \frac{1}{M} \sum \Delta_i.$$

Thus, similar to the first order ADC, if the sequence of combination of elements consists of all possible combinations of these unit elements, than this averaging will lead to the random variations effectively canceling each other out so that the final result will have no random variation.

Figure 6:
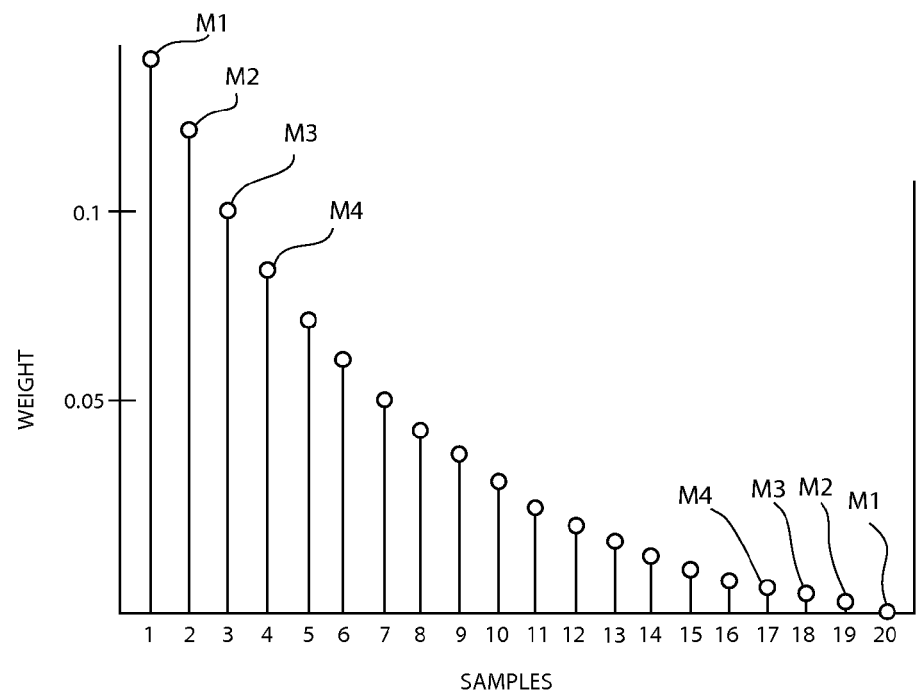
FIG. 6 is a graph of the sample weights for a third order incremental ADC using 20 samples.

The second order DEM rotation scheme may also be utilized to generate sample signals for third order and higher incremental ADCs. A third order incremental ADC is a system that utilizes a third order noise shaping function for integrating the samples to generate the output. An example of the sample weights assigned to twenty samples in accordance with a third order noise shaping function is depicted in FIG. 6. As depicted in FIG. 6, the third order noise shaping function is a non-linear, non-constant weighting function. Therefore, if the second order DEM rotation scheme is utilized to generate the twenty samples and they are weighted according to FIG. 6, the averages of the sample weights allocated to each combination are not equal. For example, the average of the weights allocated to the $1^{st}$ and the $20^{th}$ sample do not equal the average of the sample weights allocated to the $2^{nd}$ and $19^{th}$ sample, and so on. Therefore, each combination does not contribute with the same total weight to the output. However, the second order DEM rotation scheme enables the combinations to be approximately averaged against each other which is still an improvement compared to state-of-the-art dynamic element matching.

As mentioned, incremental ADCs may require many more samples in order to generate the digital output value than there are M combinations of elements in the second order DEM rotation scheme, i.e., 2*M. To accommodate oversampling, the number of samples utilized by the ADC to generate the output value may be set to any multiple of 2*M that is greater than the number of samples required for the ADC. One embodiment of an oversampling rotation scheme that may be used for oversampling is given by the sequence: $\{M_1, M_1, \ldots, M_2, M_2, \ldots, \ldots, M_{M-1}, M_{M-1}, \ldots, M_M, M_M, \ldots, M_M, M_M, \ldots, M_{M-1}, M_{M-1}, \ldots, M_2, M_2, \ldots, \ldots, M_1, M_1 \ldots\}$ where each of the combinations $M_1$ to $M_M$ is repeated consecutively an equal number of times before moving on the next combination in the sequence in order to accommodate the total number of samples. If the total number of samples required for oversampling is, for example, 3220 and the total number of configurations is 10, then each combination in the sequenced is repeated seven times consecutively so that each combination generates a total of 14 samples. The total number of samples generated for the sequence is then 140 which is greater than the number required of 3048. In addition, the symmetry is maintained, i.e., each combination contributes an equal number of times to the output and the total weight allocated to the samples generated by each combination is the same.

In another embodiment, the core sequence of $\{M_1, M_2, \ldots M_{M-1}, M_M, M_M, M_{M-1}, \ldots M_2, M_1\}$ is repeated until the total number of samples required is generated. Similar to above, if the total number of samples required for oversampling is, for example, 3048 and the total number of configurations is 10, then the core sequence of $\{M_1, M_2, \ldots M_{M-1}, M_M, M_M, M_{M-1}, \ldots M_2, M_1\}$ may be repeated seven times consecutively so that each combination generates a total of 14 samples for a total of 140 samples during the sequence. Each combination still contributes an equal number of times to the output and the total weight allocated to the samples generated by each combination is the same.

Both of the above oversampling cycling sequences work equally well for a system with non-constant but linear weights, such as a second-order incremental ADC. The second oversampling cycling sequence may provide a more accurate approximation for systems having non-constant and non-linear weights such as a third order incremental ADC.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

What is claimed is:

1. A sensor system for generating analog signals for processing by a signal processing circuit that utilizes non-constant weights, the sensor system comprising:
   a plurality of signal generating elements;
   a switching network operably coupled to the plurality of signal generating elements for switching the plurality of signal generating elements between a number M of different configurations; and
   a dynamic element matching (DEM) control system for controlling the switch network to implement a second order DEM rotation scheme in which the plurality of signal generating elements are switched to each of the M configurations in a first sequence and then switched to each of the M configurations in a second sequence, the second sequence being the reverse of the first sequence.

2. The system of claim 1, wherein the DEM control system is configured to control the switch network so that the plurality of signal generating elements are switched from configuration to configuration according to the second order DEM rotation scheme at a sample rate set by a system clock.

3. The system of claim 2, wherein each configuration of elements in the first and the second sequences outputs a sample analog signal.

4. The system of claim 3, wherein the plurality of signal generating elements are for implementing a first circuit device and a second circuit device that have a predetermined ratio with respect to each other.

5. The system of claim 4, wherein the plurality of different configurations corresponds to a number of ways the plurality of signal generating elements may be allocated to implement the first circuit device and the second circuit device.

6. The system of claim 3, further comprising:
   an incremental analog-to-digital converter (ADC) that receives the sample analog signals and averages them in accordance with a noise transfer function to generate a final digital output value.

7. The system of claim 6, wherein the incremental ADC is an nth order incremental ADC where n is greater than 1.

8. The system of claim 7, wherein the incremental ADC requires a first number of samples to generate a digital output value, the first number being greater than or equal to the total number of configurations in the first and second sequences combined; and
   wherein during the second order DEM rotation scheme each configuration is activated consecutively a predetermined number of times in both the first and the second sequence to generate a sample analog signal, the predetermined number multiplied by the total number of configurations in the first and second sequences being greater than the first number.

9. The system of claim 7, wherein the incremental ADC requires a first number of samples to generate a digital output value, the first number being greater than or equal to the total number of configurations in the first and second sequences combined; and
   wherein the first sequence and the second sequence are repeated a predetermined number of times wherein the predetermined number multiplied by the total number of configurations in the first and second sequences is greater than the first number.

10. A method of operating a sensor system to generate sample analog signals for processing by a signal processing circuit that utilizes non-constant weights, the sensor system including a plurality of signal generating elements for implementing a sensor assembly, the plurality of signal generating elements being operably coupled for switching between a plurality of possible combinations for implementing the sensor assembly, the method comprising:
   switching the plurality of signal generating elements to each of the possible configurations in a first sequence, and activating the plurality of signal generating elements to output a sample analog signal for each configuration in the first sequence; and
   after the first sequence, switching the plurality of signal generating elements to each of the possible configurations in a second sequence, the second sequence being the reverse of the first sequence, and activating the plurality of signal generating elements to output a sample analog signal for each configuration in the second sequence.

11. The method of claim 10, the plurality of signal generating elements being switched to the different possible configurations in the first and the second sequence at a sample rate.

12. The method of claim 11, wherein the signal processing circuit requires a first number of samples to generate a digital output value, the first number being greater than or equal to the total number of configurations in the first and second sequences combined;
wherein the plurality of circuit elements output s number of sample analog signals in succession for each configuration in the first and second sequences, where s multiplied by the total number of configurations in the first and second sequences is at least as great as the first number.

13. The method of claim 11, wherein the signal processing circuit requires a first number of samples to generate a digital output value, the first number being greater than or equal to the total number of configurations in the first and second sequences combined; and
wherein a core sequence comprising the first and second sequences is repeated t times, where t multiplied by the total number of configurations in the first and second sequences is at least as great as the first number.

14. The method of claim 10, wherein the plurality of signal generating elements are for implementing a first circuit device and a second circuit device having a predetermined ratio with respect to each other.

15. A signal generating and processing system comprising:
a sensor system including:
a plurality of signal generating elements;
a switching network for switching the plurality of signal generating elements between a plurality of different configurations; and
a dynamic element matching (DEM) control system for controlling the switch network to implement a second order DEM rotation scheme in which the plurality of signal generating elements are switched to each configuration in the plurality of configurations in a first sequence and then switched to each configuration in a second sequence, the second sequence being the reverse of the first sequence, and wherein the plurality of signal generating elements are activated in each configuration to output a sample analog signal; and
a signal processing circuit for receiving the sample analog signals, the signal processing circuit being configured to combine the sample analog signals received during the second order DEM rotation scheme in accordance with a noise shaping function to generate a discrete output value, the noise shaping function allocating non-constant weights to each of the sample analog signals at which the sample analog signals contribute to the generation of the discrete output value.

16. The system of claim 15, wherein the signal processing circuit is an nth order incremental ADC where n is greater than 1.

17. The system of claim 15, wherein the signal processing circuit is an second order incremental ADC, and
wherein the noise shaping function allocates linear, non-constant weights to each of the sample analog signals at which the sample analog signals contribute to the generation of the discrete output value.

18. The system of claim 15, wherein the signal processing circuit is a third order incremental ADC, and
wherein the noise shaping function allocates non-linear, non-constant weights to each of the sample analog signals at which the sample analog signals contribute to the generation of the discrete output value.

* * * * *